(12) United States Patent
Ziegler (10) Patent No.: US 7,046,088 B2
(45) Date of Patent: May 16, 2006

(54) POWER AMPLIFIER

(75) Inventor: Joachim Ziegler, Schwanau (DE)

(73) Assignee: Huettinger Elektronik GmbH & Co., Freiburg (DE)

( * ) Notice: Subject to any disclaimer, the term of this patent is extended or adjusted under 35 U.S.C. 154(b) by 47 days.

(21) Appl. No.: 10/937,395

(22) Filed: Sep. 13, 2004

(65) Prior Publication Data

US 2005/0088231 A1 Apr. 28, 2005

Related U.S. Application Data

(63) Continuation of application No. PCT/EP03/02533, filed on Mar. 12, 2003.

(30) Foreign Application Priority Data

Mar. 12, 2002 (DE) ................................ 102 11 609

(51) Int. Cl.
*H03F 3/217* (2006.01)
(52) U.S. Cl. .................................. 330/251; 330/207 A
(58) Field of Classification Search ................ 330/251, 330/207 A, 292, 51, 305, 306
See application file for complete search history.

(56) References Cited

U.S. PATENT DOCUMENTS 3,919,656 A 11/1975 Sokal et al.

(Continued)

FOREIGN PATENT DOCUMENTS

DE 39 42 560 6/1991

(Continued)

OTHER PUBLICATIONS

Everard, J.K.A. and Wilkinson, A.J., "Highly Efficient Class E Amplifiers," *Electronics Division, Colloquium on "Solid-State Power Amplifiers,"* Dec. 16, 1991, Digest No. 1991/191, pp. 3/1-3/4.

(Continued)

*Primary Examiner*—Henry Choe
(74) *Attorney, Agent, or Firm*—Fish & Richardson P.C.

(57) ABSTRACT

A power amplifier for generating a sinusoidal high-frequency signal to be supplied to a load includes a current source adapted to supply a constant electrical current during a portion of a period of a fundamental wave, a first driver circuit that generates a first current wave, and a second driver circuit that generates a second current wave, and a filter network. The first driver circuit includes a first switching element adapted to switch at a fundamental frequency of the fundamental wave between a high ohmic state and a low ohmic state to draw current from the current source, a first capacitance connected in parallel to the first switching element, and a first reactive element to phase shift a first periodic signal. The first driver circuit has a first internal resistance. The second driver includes a second switching element adapted to switch at the fundamental frequency of the fundamental wave between a high ohmic state and a low ohmic state to draw current from the current source, a second capacitance connected in parallel to the second switching element, and a second reactive element to phase shift a second periodic signal. The second driver circuit has a second internal resistance. The filter network includes an oscillating circuit that has a capacitor connected in parallel with the load and a first inductor connected in series with the first internal resistance and a second inductor in series with the second internal resistance. The oscillating circuit is tuned to the fundamental frequency of the fundamental wave, and the oscillating circuit is adapted to perform a resistance transformation from the first and second internal resistances of the driver circuits to the load. At least one resistor is arranged between the first driver circuit and the second driver circuit, and a resistance of the resistor is selected to cause a phase correction between the first current wave and the second current wave.

14 Claims, 10 Drawing Sheets

U.S. PATENT DOCUMENTS

| | | | |
|---|---|---|---|
| 4,717,884 | A | 1/1988 | Mitzlaff |
| 5,187,580 | A | 2/1993 | Porter, Jr. et al. |
| 5,535,438 | A | 7/1996 | Sevic |
| 5,747,935 | A | 5/1998 | Porter et al. |
| 6,046,546 | A | 4/2000 | Porter et al. |
| 6,229,392 | B1 | 5/2001 | Porter et al. |
| 6,724,255 | B1 * | 4/2004 | Kee et al. .................. 330/251 |
| 6,762,645 | B1 * | 7/2004 | Grant ......................... 330/251 |
| 6,784,732 | B1 * | 8/2004 | Hajimiri et al. ............ 330/251 |

FOREIGN PATENT DOCUMENTS

| | | |
|---|---|---|
| DE | 41 19 738 | 12/1992 |
| JP | 06-334446 | 12/1994 |
| JP | 07-170132 | 7/1995 |

OTHER PUBLICATIONS

Albulet, M., and Zulinski, R.E., "Effect of Switch Duty Ratio on the Performance of Class E Circuits," *Proceedings of the 40th Midwest Symposium on Circuits and Systems*, Aug. 3-6, 1997, pp. 99-105.

Tan, Q. -S., et al., "Class-E High Efficiency Power Amplifiers," *Proceedings of the 35th Midwest Symposium on Circuits and Systems*, Aug. 9-12, 1992, pp. 118-120.

Gudimetla, V.S. Rao, and Kain, A.Z., "Design and Validation of the Load Networks for Broadband Class E Amplifiers using Nonlinear Device Models," *1999 IEEE MTT-S Digest*, Jun. 13, 1999, pp. 823-826.

Tsai, K-C., and Gray, P.R., "A 1.9-GHz, 1-W CMOS Class-E Power Amplifier for Wireless Communications," *IEEE Journal of Solid-State Circuits*, vol. 34, No. 7, Jul. 1999, pp. 962-970.

Raab, F.H., "Electronically Tunable Class-E Power Amplifiers," *2000 IEEE MTT-S Digest*, May 20, 2001, pp. 1513-1516.

Mertens, K.L.R., and Steyaert, M.S.J., "A 700-MHz 1-W Fully Differential CMOS Class-E Power Amplifier," *IEEE Journal of Solid-State Circuits*, vol. 37, No. 2, Feb. 2002, pp. 137-141.

Kazimierczuk, M.K., and Bui, X.T., "Class-E Amplifier with an Inductive Impedance Inverter," *IEEE Transactions on Industrial Electronics*, vol. 37, No. 2, Apr. 1990, pp. 160-166.

Kawahara, T., and Suetsugu, T., "Class E Frequency Multiplier Driving Class E Amplifier," *Telecommunications Energy Conference, 1997*, Oct. 19-23, 1997, pp. 617-621.

Gupta, R., and Allstot, D.J., "Fully Monolithic CMOS RF Power Amplifiers: Recent Advances," *IEEE Communications Magazine*, Apr. 1999, pp. 94-98.

Alinkula, P. et al., "Design of Class E Power Amplifier with Nonlinear Parasitic Output Capacitance," *IEEE Transactions on Circuits and Systems—II: Analog and Digital Signal Processing*, vol. 46, No. 2, Feb. 1999, pp. 114-119.

Chudobiak, M.J., "The Use of Parasitic Nonlinear Capacitors in Class E Amplifiers," *IEEE Transactions on Circuits and Systems—I: Fundamental Theories and Applications*, vol. 41, No. 12, Dec. 1994, pp. 941-944.

"RFSuite™ Where Power Meets Intelligence," Product Brochure, Advanced Energy Industries, Inc., 2000, 4 pages.

"RFG and RFXII Series 13.56 MHz Power Supplies with 1250 W Output," Product Brochure, Advanced Energy Industries, Inc., 3 pages.

"RFG 3000 W, 13.56 MHz, CE Power Supplies," Product Brochure, Advanced Energy Industries, Inc., 2 pages.

"APEX™ RF Power Delivery: 13.56 MHz, 1.5KW to 10 kW Power Delivery Systems," Product Brochure, Advanced Energy Industries, Inc., 2000, 4 pages.

Raab, F.H., "Analysis of Class-E Power Amplifiers" Green mountain Radio Research Company Rev. D Feb. 24, 1989, Seminar Notebook GMRR RN82-36D, pp. 1-12.

Sokal, N.O., and Redl, R., "Power Transistor Output Port Model," *RF Design*, Jun. 1987, p.17-22.

Herbert L. Krauss et al., "Class E Amplification," Chapter 14-3, *Solid State Radio Engineering* 1980, p. 448-453.

* cited by examiner

POWER AMPLIFIER

CROSS-REFERENCE TO RELATED APPLICATIONS

This application is a continuation of PCT Application Ser. No. PCT/EP03/02533, filed on Mar. 12, 2003, the entire disclosure of which is incorporated herein by reference. The PCT application claims Convention priority from German Application Serial No. DE 102 11 609.1, filed on Mar. 12, 2002, the entire disclosure of which is also incorporated herein by reference.

TECHNICAL FIELD

The invention relates to the generation of sinusoidal high-frequency signals by a power amplifier for operating a load.

BACKGROUND

High-frequency power generators are used for the power supply of plasma-generating loads, for example, plasma chambers for etching or sputtering, or $CO_2$ power lasers, as well as for the voltage supply of coils of industrial heating systems. High-frequency power generators can generate an output voltage with a frequency, for example, between 50 kHz and 50 MHz and an output power, for example, of up to several kW. The high-frequency power is often generated by a quartz oscillator or by an oscillator stabilized by an oscillating circuit in the small signal range and is amplified in downstream amplifier stages in order to be then amplified to the demanded power level. A class E amplifier is often used for amplification in the amplifier stages.

The operation of a typical E amplifier is described, for example, in U.S. Pat. No. 3,919,656 and is explained in more detail with reference to FIG. 15. The configuration of such a class E amplifier includes, in principle, a switching element 3, a capacitor 4 in parallel with the switching element 3, a voltage source 1 that is connected to the switching element 3 and the capacitor 4 by a high-frequency choke 2, as well as a series oscillating circuit 10. The high-frequency choke 2, by which the amplifier is connected to a supply voltage, is large enough to ensure a constant current during the period of the fundamental wave. The series oscillating circuit 10 is tuned to the fundamental frequency and only allows a sinusoidal characteristic of the current to reach the load resistance 9. An additional reactive element 7 generates a phase shift, by means of which the switching conditions for the switch are adjusted. The turn-on point of the switch 3 should be chosen such that the voltage at the capacitor 4 is preferably zero, to avoid losses due to discharging of the capacitance via the switch 3. Additionally, it is advantageous if the voltage variation is as small as possible for a long period of time for the losses due to a finite turn-on time of the real switch to remain as small as possible.

As described in U.S. Pat. No. 3,919,656, the series resistance, which represents the load 9, and the series capacitor 5 are converted by means of known impedance transformation into a parallel circuit with a first capacitor to ground and a series circuit of a second capacitor and a resulting load resistor, which also lies at ground. At the resulting center tap of the two capacitors the inductor 6 is connected. Such a circuit results in a comparable behavior to that of the circuit according to FIG. 15 at the one frequency, for which this impedance transformation is performed, however, for other frequencies the circuit behaves differently.

Thus, U.S. Pat. No. 3,919,656 shows equivalent circuits for the series oscillating circuit 10, which have a similar function at the fundamental frequency to the series oscillating circuit.

Figure 15:
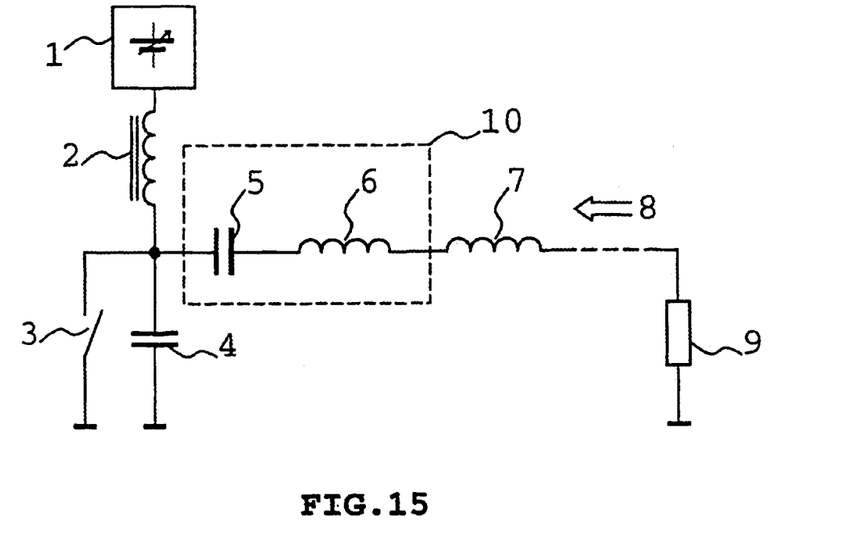
FIG. 15 is a schematic circuit diagram of a classical class E amplifier.

In the classical class E amplifier according to FIG. 15 a resistance transformation occurs. To avoid reflections and losses, the resistance of the load 9 should equal the internal resistance of the amplifier 8. In the technical field typical loads are approximately 50 Ω. The internal resistance of the amplifier 8, which is determined by the required power and the maximum voltage that is present at the switch 3, is normally smaller than 50 Ω. Among others, the devices used for the switch 3 limit the maximum value of the voltage, since they have a finite breakdown voltage.

Figure 16:
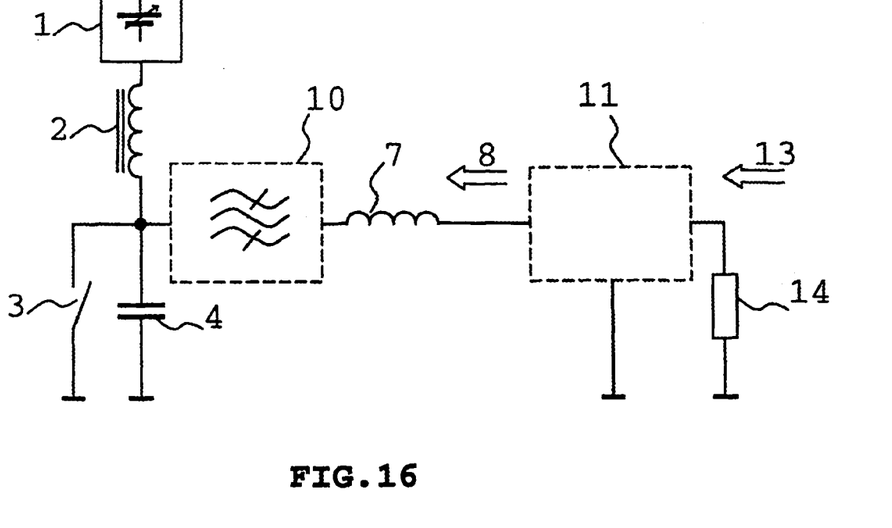
FIG. 16 is a schematic circuit diagram of a classical class E amplifier with matching network.

FIG. 16 shows this class E amplifier with a resistance-matching network 11, which transforms the internal resistance of the amplifier 8 to the resistance 13, which is ideally equal to the resistance of the load 14. For matching to the required load resistance, as shown in FIG. 16, matching networks 11 may be provided, which are lossy and lead to reduction of the overall efficiency.

SUMMARY

The invention relates, at least in part, to a high-frequency power generator with an improved class E amplifier, which has a matching network for matching the internal resistance of the amplifier to the resistance of a load, but reduces the lossy elements that originate from the additional matching network and thus increases the overall efficiency of the power generator. Additionally, a switching element (e.g., one or several MOS-FET switches) that is used in a power generator is driven such that the power loss of the driver circuit is kept as small as possible.

In a first general aspect, a power amplifier for generating a sinusoidal high-frequency signal to be supplied to a load includes a current source adapted to supply a constant electrical current during a portion of a period of a fundamental wave, a first driver circuit that generates a first current wave, and a second driver circuit that generates a second current wave, and a filter network. The first driver circuit includes a first switching element adapted to switch at a fundamental frequency of the fundamental wave between a high ohmic state and a low ohmic state to draw current from the current source, a first capacitance connected in parallel to the first switching element, and a first reactive element to phase shift a first periodic signal. The first driver circuit has a first internal resistance. The second driver includes a second switching element adapted to switch at the fundamental frequency of the fundamental wave between a high ohmic state and a low ohmic state to draw current from the current source, a second capacitance connected in parallel to the second switching element, and a second reactive element to phase shift a second periodic signal. The second driver circuit has a second internal resistance. The filter network includes an oscillating circuit that has a capacitor connected in parallel with the load and a first inductor connected in series with the first internal resistance and a second inductor in series with the second internal resistance. The oscillating circuit is tuned to the fundamental frequency of the fundamental wave, and the oscillating circuit is adapted to perform a resistance transformation from the first and second internal resistances of the driver circuits to the load. At least one resistor is arranged between the first driver circuit and the second driver circuit, and a resistance of the resistor is selected to cause a phase correction between the first current wave and the second current wave.

The power amplifier may include one or more of the following features. For example, the power amplifier may further include a first resistor having a first terminal connected between the first inductor and the first driver circuit and a second terminal connected to a star point and a second resistor having a first terminal connected between the second inductor and the second driver circuit and a second terminal connected to the star point. The current source, the first and second inductors, and the capacitor parallel to the load may be connected in a node. The power amplifier may further include a capacitor between the filter network and the load adapted to filter out a DC component of the signal to be supplied to the load. The current source may further include a parallel oscillating circuit tuned to the fundamental frequency. The filter network can further include a second inductor in series with the capacitor, and a resonant frequency of the second inductor and the capacitor of the filter network can be adapted to attenuate a first harmonic frequency of the fundamental frequency. The filter network can be adapted to pass a broadband of frequencies in the range of the fundamental wave while suppressing harmonic frequencies. The filter network can further include two matching half-sections, in which each half-section includes an oscillating circuit having a capacitor in parallel with the load and an inductor in series with the load, where each half-section is tuned to the fundamental frequency and where the filter network further includes a capacitor connected in series with the two half-sections for filtering a DC component of the signal. The first switching element can include at least one MOS-FET, and the second switching element can include at least one MOS-FET.

In another general aspect, a method of generating a sinusoidal high-frequency signal for operating a load includes providing a current source to supply constant electrical current during a portion of a period of a fundamental wave, switching a first switching element switching at a fundamental frequency of the fundamental wave between a high ohmic state and a low ohmic state to generate a first current wave, phase-shifting the first current wave with a first reactive element, switching a second switching element at a fundamental frequency of the fundamental wave between a high ohmic state and a low ohmic state to generate a second current wave, phase-shifting the second current wave with a second reactive element, matching a first internal resistance of the first switching element and the first reactive element and a second internal resistance of the second switching element and the second reactive element to a resistance of the load with a matching filter network comprising an oscillating circuit having a capacitor connected in parallel with the load and a first inductor connected in series with the first internal resistance and a second inductor connected in series with the second internal resistance, where the oscillating circuit is tuned to the fundamental frequency, and aligning the phases of the first current wave and the second current wave.

The method can include one or more of the following features. For example, the method can further include decoupling a DC component of the signal directly upstream of the load. The method can further include filtering the signal with an oscillating circuit as a filter element tuned to the fundamental frequency to pass the fundamental frequency. The matching can be performed by the matching filter network such that a broadband transmission range forms in the range of the fundamental frequency, and at the same time waves with harmonic frequencies are suppressed. The method can further include repeatedly switching the switching element between the high ohmic state and the low ohmic state with a period in which the switching element is in the high ohmic state for about 60% of the period and is in the low ohmic state for about 40% of the period.

In a further general aspect, a power generator for driving a load includes an input stage, at least two driver stages downstream from the input stage, where each driver stage includes a power amplifier having a downstream final stage circuit that is interconnected with the other final stage circuits at a star point, and where an output terminal of each driver stage is connected in a current node, at which current is fed via a choke or a parallel oscillating circuit and at which a ground capacitor is connected.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DESCRIPTION OF DRAWINGS

Like reference symbols in the various drawings indicate like elements.

DETAILED DESCRIPTION

An overview is first provided and then particular embodiments are described.

Overview

Figure 1:
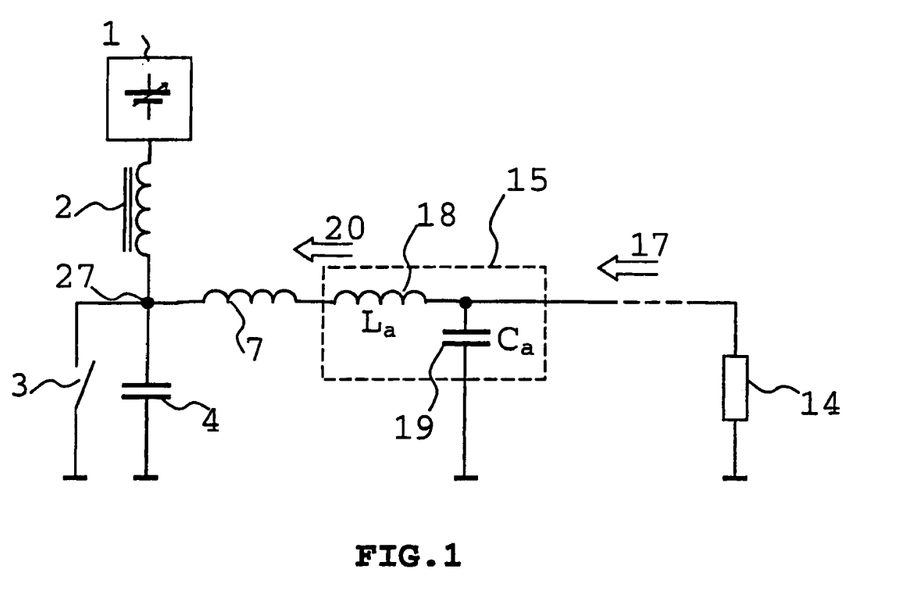
FIG. 1 is a schematic circuit diagram of a high-frequency power generator with an integrated filter-matching network.
Figure 2:
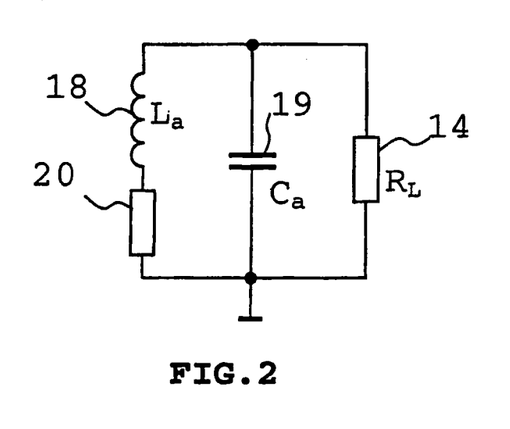
FIG. 2 is a schematic equivalent circuit diagram of a parallel oscillating circuit resulting from the circuit according to FIG. 1.

A series resonant circuit of the classical class E amplifier can be modified by a parallel oscillating circuit as shown in FIGS. 1 and 2. This is not just a transformation of the series oscillating circuit into a series and a parallel element, but a completely novel concept. First, the parallel oscillating circuit is tuned to the frequency of the fundamental wave such that it is ensured that the current through the inductor 18 consists mainly of the fundamental wave, and, thus, the circuit meets an important requirement of the class E-amplifier. Furthermore, the parallel oscillating circuit is dimensioned such that a resistance transformation from the internal resistance of the driving circuit 20 to the load 14 is realized. Thus, several important advantages arise.

First, an additional resistance-matching network may be dispensed with, such that costs and device losses can be saved.

Second, this circuit may be realized with much lower values for inductance and capacitance, such that advantageous configurations are possible.

Figure 3:
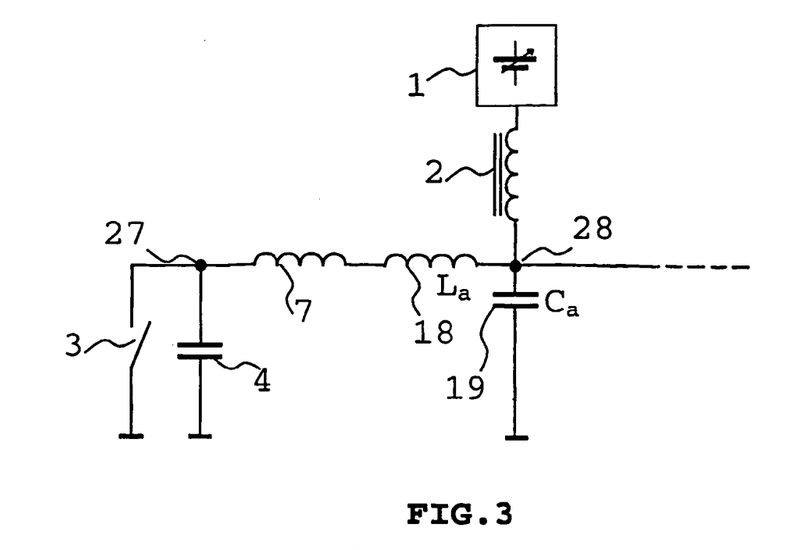
FIG. 3 is a schematic circuit diagram as in FIG. 1 with relocated current supply.
Figure 4:
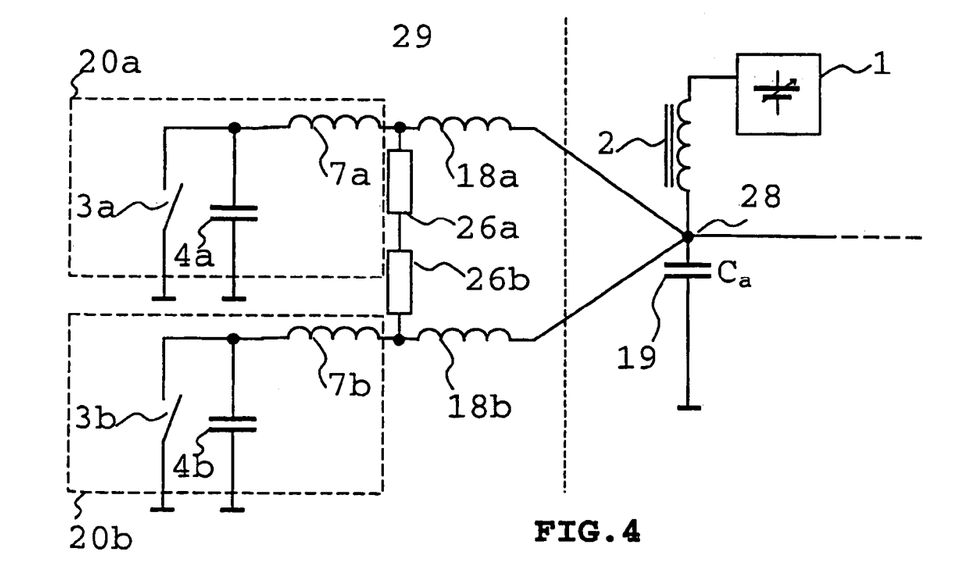
FIG. 4 is a schematic circuit diagram as in FIG. 3 extended to two switching paths with the resistances to provide for phase correction.
Figure 5:
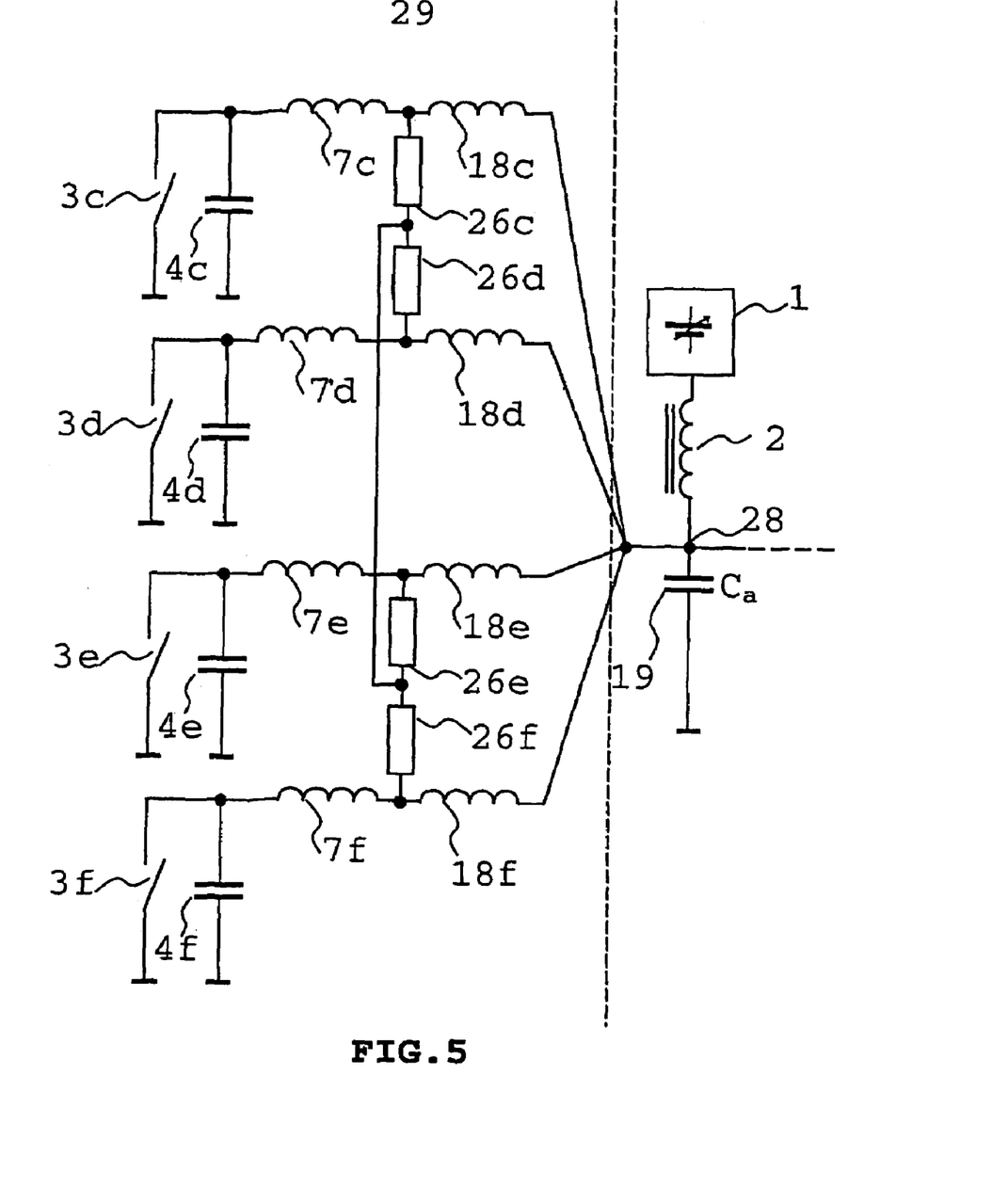
FIG. 5 is a schematic circuit diagram as in FIG. 3 or FIG. 4 with the extension to four switching paths with the resistances to provide for phase correction.

Third, a circuit embodied in such a way makes possible the repositioning of the current supply from the switch-side end of the combination of the inductors 7 and 18 to the load-side end of these inductors, as shown in FIG. 3. By this relocation of the current supply, the following advantages and possible embodiments arise. Due to the relocation of the current supply, several switches with smaller capacitances each may be arranged in parallel via a combination of inductors, as shown in FIGS. 4 and 5 instead of providing one switch with one capacitance. The parallel arrangement allows amplification of very large power with significantly cheaper devices for the switching elements. However, in practice, phase differences in the individual branches arise due to differences of the switches in switching speed, turn-on voltage at the gate, and differences in the parasitic devices even if synchronously driving driver stages are used. The interconnection via the inductances of these switching elements switching slightly differently has the advantage that resistances may be added from one branch to the other for phase correction, as shown in FIGS. 4 and 5.

Figure 6:
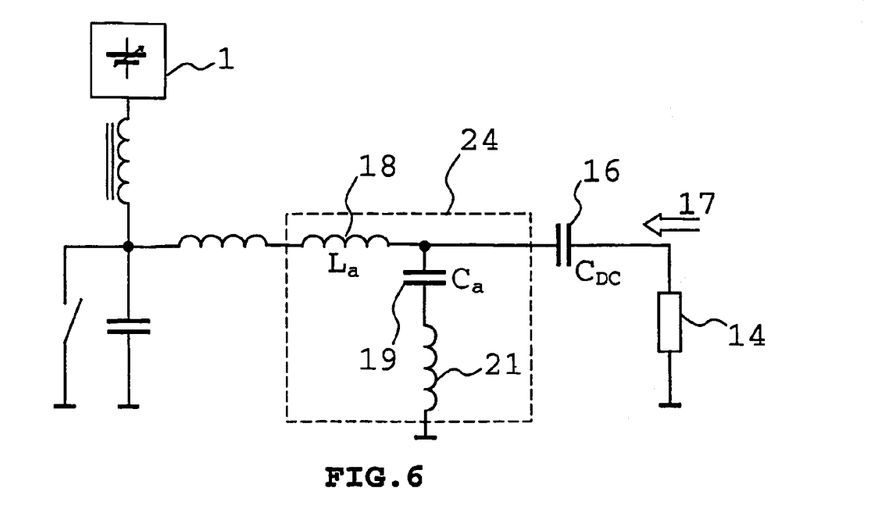
FIG. 6 is a schematic circuit diagram as in FIG. 1 including a DC decoupling capacitor and a series inductor.

Fourth, the parallel oscillating circuit shown in FIG. 1 may be extended by the addition of an inductor 21 in series with a capacitor 19, as shown in FIG. 6. The resulting series resonance filter can be tuned to the first harmonic wave, such that those parts are shorted to ground, and, therefore, the signal has a lower distortion factor.

Furthermore, as shown in FIG. 6, a capacitor 16 can be used between the supply unit 1 and the load 14 for removing the direct current component from the supply unit 1. The capacitor 16 can be located directly upstream of the load 14. Thus, the capacitor 16 can have a lower capacitance and be stressed with lower currents than the omitted capacitor 5 of the traditional class E amplifier, as shown in FIG. 15. Hence, capacitors 16 having higher quality and lower losses may be used, thus further increasing the overall efficiency.

Figure 8:
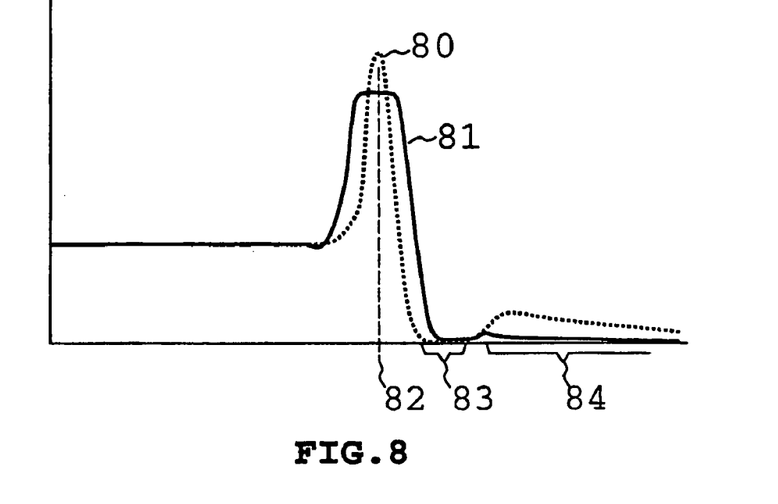
FIG. 8 is a graph showing a comparison between the attenuation behavior of circuits having one and with two matching sections.

In a further embodiment, the matching element can be a two-stage matching element composed of two directly coupled matching half sections. By a suitable dimensioning, high frequencies are more strongly attenuated, and thus an output signal is generated with a particularly low distortion factor with those two matching half sections. On the other hand, in the region of the fundamental frequency a broadband transmission range is obtained, as shown in FIG. 8.

In a further embodiment, a DC-decoupling capacitor can be switched between the two matching sections. Thus, its parasitic terminal inductances can be compensated with the series inductance of the second matching element.

Figure 9:
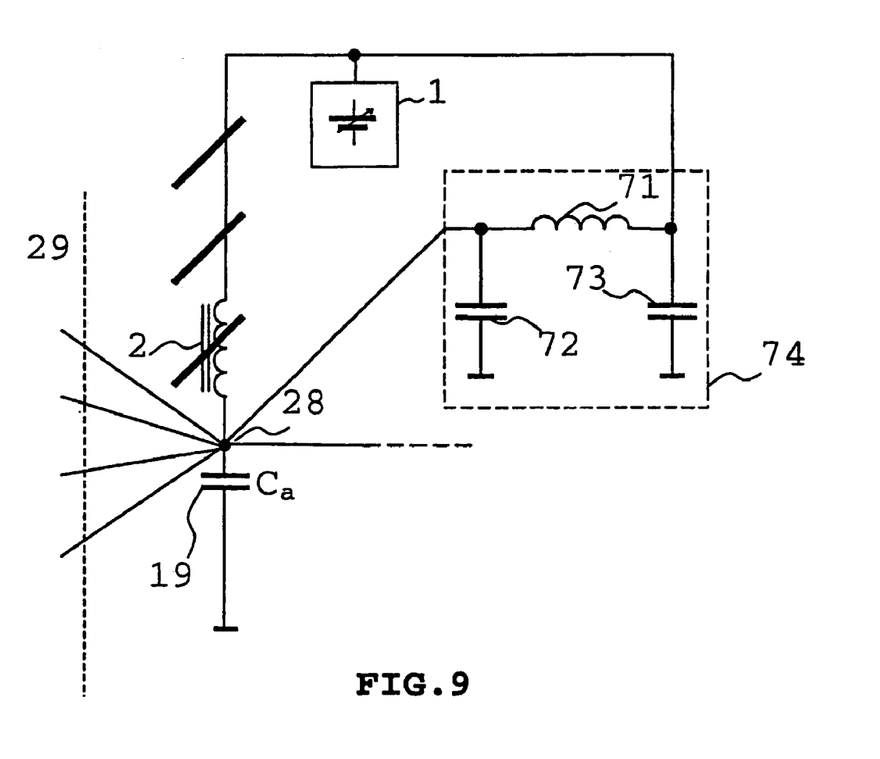
FIG. 9 is a schematic circuit diagram of the current supply network from FIGS. 3, 4, or 5 with the choke replaced by a parallel oscillating circuit.

In a further development, the current supply 1 can be relocated from node 27 to node 28, as shown in FIG. 3, to use cheaper devices. The current supply 1 should, as mentioned above, deliver a constant current over a fundamental wave. To this end, the high-frequency choke 2 has so far been used, which therefore needs to have a large inductance. To obtain such an inductance, typically, a coil with an iron core is used. On the load-side, it is ensured by the filter matching networks that only the fundamental wave and a DC-part flows. The high-frequency choke 2 can therefore be replaced by a band-eliminating filter, as shown in FIG. 9, which is tuned to the fundamental frequency, which can be realized with a significantly lower inductance and thus without an iron core, which can be significantly cheaper.

Figure 10:
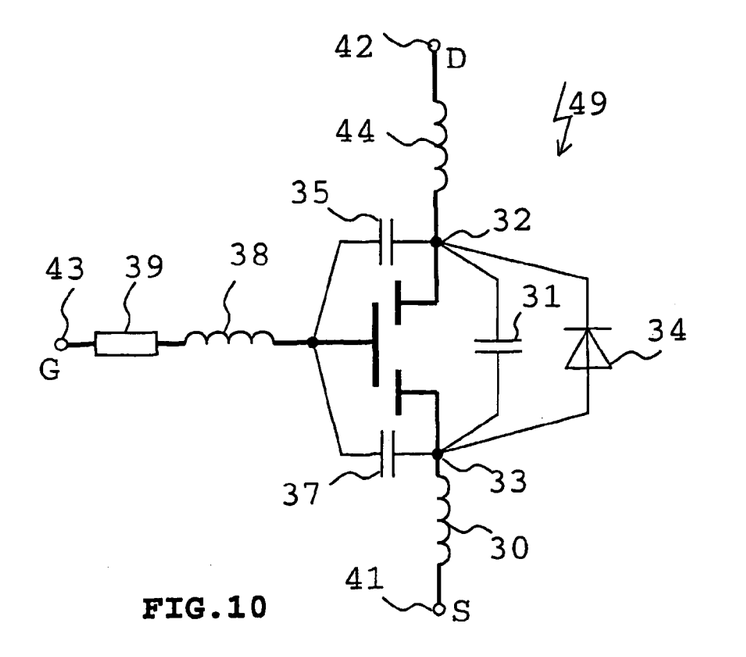
FIG. 10 is a schematic circuit diagram of a MOS-FET switch with parasitic devices.

The circuits described herein are used with a method for driving the switches. As mentioned herein, the switches 3 used to turn on the current supply 1 have a finite turn-on and turn-off time, which can vary for individual switches. The switch 3 is often realized as a MOS-FET switch. Such a MOS-FET switch has a number of parasitic devices (e.g., capacitances, inductivities, a diode-like behavior), which influence the amplifier circuit. These are shown in FIG. 10 and described below. As described above, the switches 3 should be switched on when the voltage over the switch is close to zero volts. It is advantageous that due to the phase shift set by the inductor 7 the current through the capacitor 4 has its zero crossing in this time region and therefore the change in voltage is very small in this region. The turning on of the switches 3 may therefore be pushed forwards or backwards in the region of about ±10% of the period of the fundamental wave without the voltage at the capacitor significantly differing from one in the turned-on state of the switch. Turning on the switches at a negative current is useful, since the parasitic reverse diode starts conducting and thus the turn-off time is increased. Therefore, the switches are turned on as early as possible.

As described in U.S. Pat. No. 6,299,392, which is incorporated herein by reference, the switch 3 can be deliberately turned on with a voltage still being present at the capacitor 4, and thus losses can be tolerated. However, this can be avoided with the methods described herein, and the switches should be turned on at a voltage close to zero volts, although the point in time should be the earliest possible. This may be achieved, as experiments and simulations show, with a changed duty cycle (i.e., the pulse/pause ratio), which advantageously is in the region between 50%/50% and 40%/60%.

Figure 11:
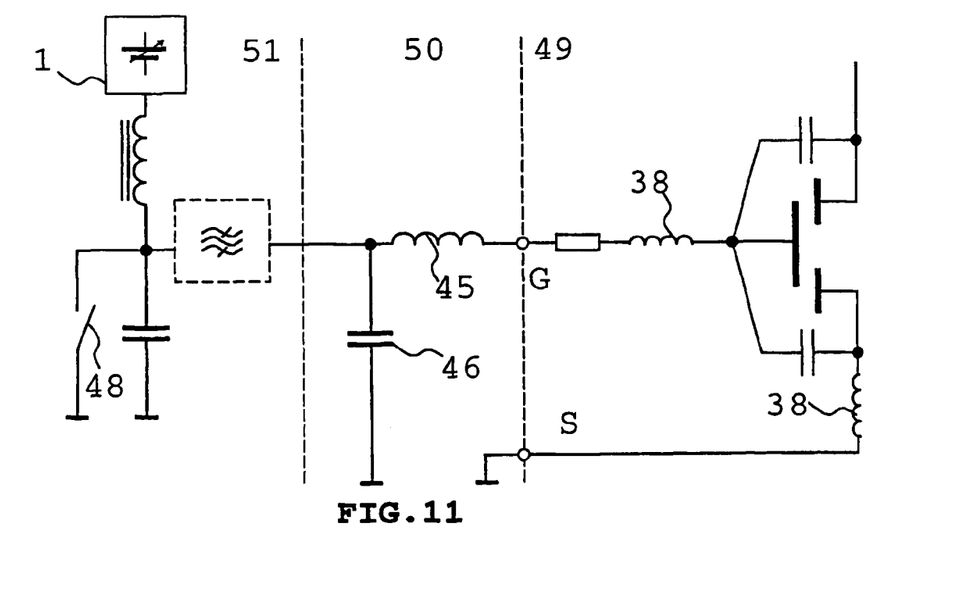
FIG. 11 is a schematic circuit diagram of a driver stage of a MOS-FET or the high-frequency power generator.

As shown in FIG. 11, for driving the gate of a switching element 48 (e.g., one or several MOS-FET switches) a gate oscillating circuit can be configured in combination with the parasitic devices of the switching element 48 and tuned to the fundamental frequency. This oscillating circuit delivers a sufficiently high current and a sufficiently high voltage for driving the switching element due to the reactive current overload, and, thus, the overall efficiency of the circuit can be increased. The effective power, which is now needed for driving the switching element, flows almost completely via the parasitic drain-gate-capacitance into the output amplifier circuit and thus into the load circuit. If this gate-oscillating circuit is driven by a class E amplifier, the latter operates particularly efficiently and stresses the current supply with a constant current.

A part of the high-frequency energy can be withdrawn at the gate-oscillating circuit and converted to a positive and a negative DC-voltage in a rectifier circuit. The oscillating circuit can be biased with these DC voltages by an active element, and, thus, the duty-cycle of the switching element can be adjusted. The withdrawal of energy from the oscillating circuit for generating the DC voltages has the additional advantage of reducing the quality factor and increases the bandwidth of this oscillating circuit and thus making the circuit less sensitive to frequency variations.

Figure 13:
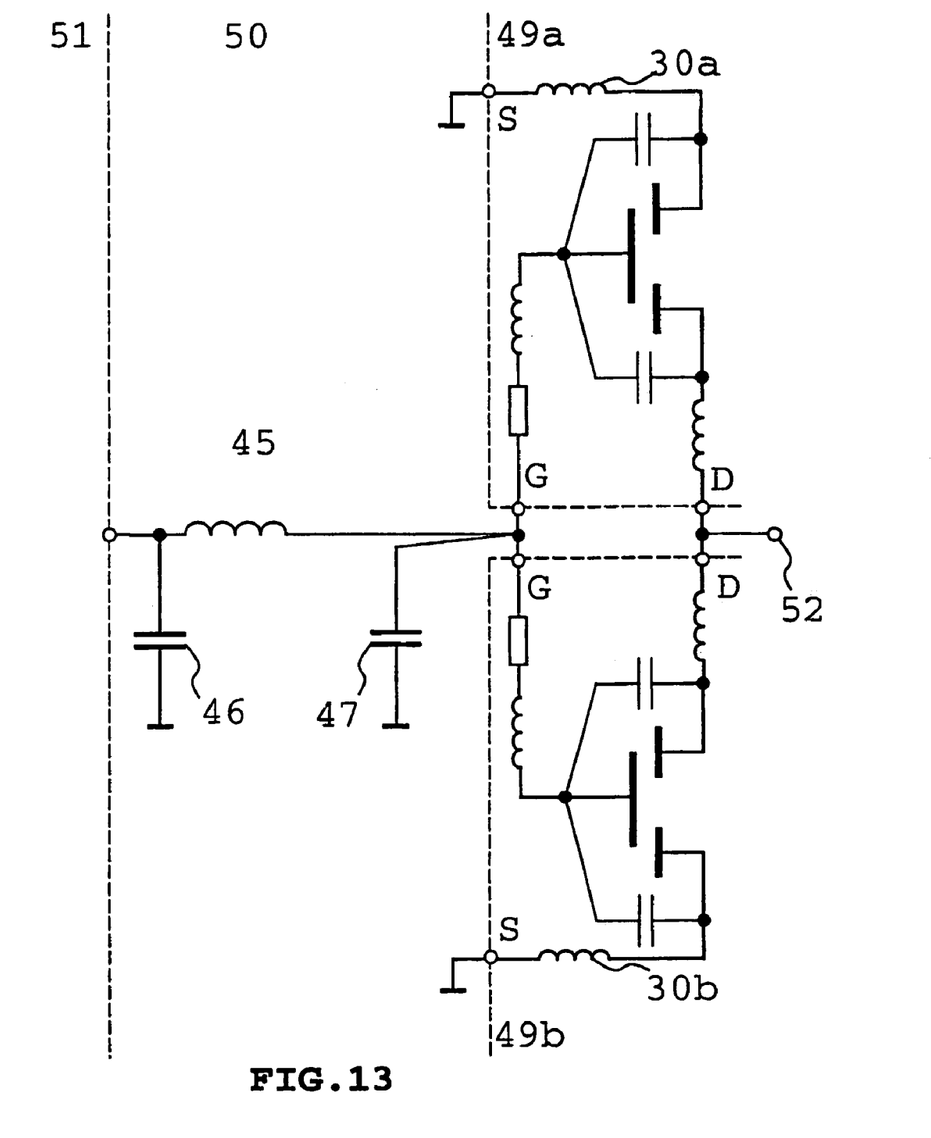
FIG. 13 is a schematic circuit diagram of an extension of a circuit as in FIG. 11.

Two MOS-FETs can be used as switching elements, as shown in FIG. 13. An advantage of the two interconnected MOS-FETs is that the voltage, which is present at the parasitic source inductance, is reduced, whereby the required gate-source voltage decreases. Furthermore, the MOS-FETs can be used for a lower switching current, which has cost advantages. Oscillations that may develop due to the parasitic reactive elements can be suppressed by an additional external capacitor from gate to ground, which may be integrated into the gate oscillating circuit, and, therefore, no lossy and switching speed reducing effective resistances are required for attenuating such oscillations.

Several driver stages 49, 50, and 51, as shown in FIG. 11 and FIG. 13 can be switched in parallel and driven synchronously, and their outputs can be brought together at a current node 28 via a matching network 7, 18, or 26 comparable to that shown in FIG. 4 or FIG. 5. On the one hand, in each driver stage transistors with lower power may be used due to this measure, and, on the other hand, the current rise velocities at turn-on time of the power transistors and the voltage developing across the lead inductance of the source terminals can be reduced. Thus, the required gate-source voltage of the power transistors decreases.

Figure 14:
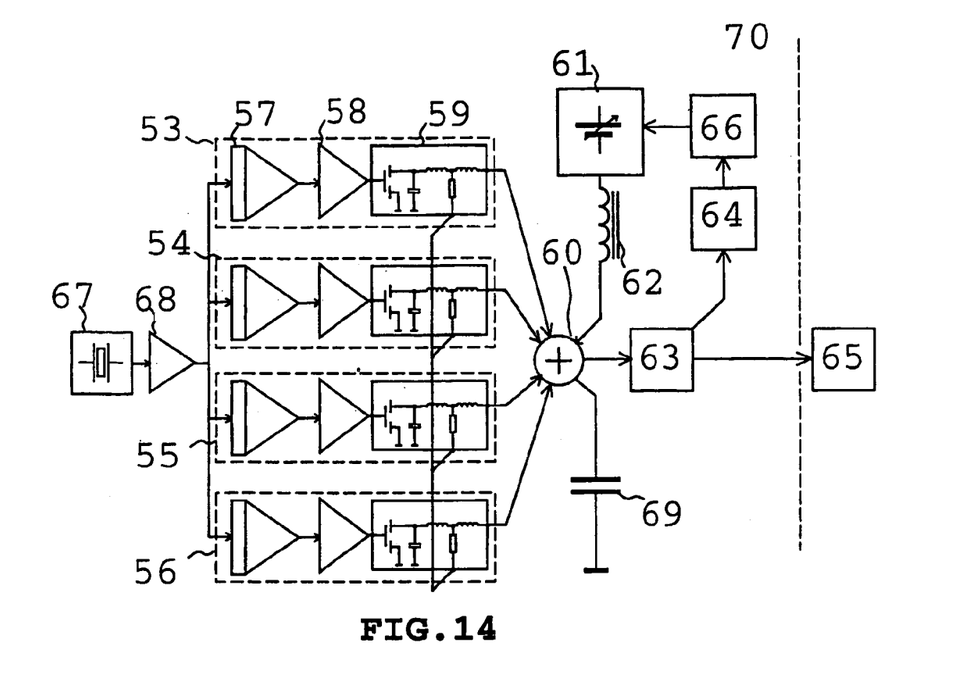
FIG. 14 is a schematic circuit diagram of a power generator with four driver stages.

All previously mentioned methods and circuits may be interconnected to a power generator in different ways. As shown in FIG. 14, a particularly suitable example of such a power generator is shown. Additional details are described herein with reference to the particular embodiments shown in the figures.

EMBODIMENTS

As shown in FIG. 1, a class E amplifier includes a current supply 1, a choke coil 2, a switching element 3, and a capacitor 4. The inductor 7 adjusts the correct phasing of the current and ensures that the conditions for the turn-on and turn-off of the switch are met. A combined filter-matching network 15, including an inductor 18 and a capacitor 19 is coupled to the output of the current supply 1. Thus, an attenuated parallel oscillating circuit is created, as can be seen from the equivalent circuit diagram in FIG. 2. This parallel circuit is tuned to the fundamental frequency and ensures a preference of the current at the fundamental frequency in the inductor 18 at sufficient quality. Thus, an essential requirement of the class E amplifier is met, i.e., the sinusoidal current at the fundamental wave frequency through inductor 18.

Additionally, this network allows resistance transformation to be achieved in the desired manner. As mentioned above, an upwards transformation from a relatively small internal resistance of the driver circuit 20 to a larger load resistance 14 is desirable. To this end the situation at the capacitor 19 is more closely inspected. The current delivered into the inductor 18 from a relatively small internal resistance of the driver circuit 20 leads to an increased voltage at the capacitor 19 and thus also at the parallel load 14. With this voltage increase at constant current, the desired upwards transformation of the resistance is obtained. The parallel oscillating circuit from FIG. 2 is now dimensioned for a desired resistance transformation, a required quality factor, and a fundamental frequency, which provides an advantage compared to the circuit concept in U.S. Pat. No. 3,919,656.

A suitable example for dimensioning shall be given for such a circuit. With a generator internal resistance of 2 Ω, a load resistance of 50 Ω, and the oscillating circuit tuned to 13,56 MHz, an oscillating circuit with a quality factor of about 2.5 can be created with an inductance of about 100 nH and a capacitance of about 1 nF. Such an inductance may be easily realized through a track conductor coil on a circuit board without an iron- or ferrite core, which is a relatively inexpensive construction compared with an iron- or ferrite core. The obtained quality factor is sufficient for ensuring the class E operation and still offers sufficient bandwidth in the region of the fundamental frequency without reacting to frequency variation over sensitively.

A further development of the circuit is shown in FIG. 3. Here, the current supply 1 and 2 is not fed into the node 27 but into the node 28. Because the inductors 7 and 18 are purely reactive elements, and the current supply 1 and 2 supplies a constant current (i.e., a DC-current) at close to the fundamental frequency, this measure does not affect the functionality of the circuit. Advantages of this measure may be explained with reference to FIGS. 4 and 5.

As shown in FIG. 4, two driver circuits 20a and 20b, each contain a switch 3a and 3b, respectively, and a capacitor 4a and 4b, respectively. Each driver circuit 20a and 20b also contains an inductor 7a and 7b, respectively through which it is connected to the node 28. For various reasons it is not possible to generate a completely synchronous behavior at the output even with identical switches (e.g., transistors) driven synchronously. Transistors switching differently generate different phasing of the fundamental wave in the oscillating circuits (e.g., the driver circuit 20a and the inductor 18a, and the driver circuit 20b and the inductor 18b, and the capacitor 19). Resistors 26a and 26b are used to achieve phase correction between the outputs from inductors 18a and 18b and can be added between the reactive elements 7a and 7b for phase shifting and the inductors 18a and 18b of the two matching networks, thus connecting the two branches. The resistances of the resistors 26a and 26b are dimensioned such that the linear independency of the switching elements 3a and 3b is maintained as much as possible, however, a noticeable phasing correction occurs. It is not necessary to dimension these resistances for the full capability of the generator, since for phase correction only an energy must be fed that is magnitudes smaller than the generated energy of the fundamental wave.

As shown in FIG. 5, an arbitrary number of driver circuits and switching elements with matching networks can be combined. For example, the output of four switching elements 3c, 3d, 3d, and 3f in parallel with capacitors 4c, 4d, 4e, and 4e, respectively, and in series with inductors 7c, 7d, 7e, and 7f, and 18c, 18d, 18e, and 18f, respectively, can be combined. The resistances of resistors 26c, 26d, 26e, and 26f can be selected for phasing correction and the outputs from the inductors 18c, 18d, 18e, and 18f of the four driver circuits can be interconnected in a star point.

Two independent further developments are shown in FIG. 6. On the one hand, a capacitor 16 is located between the supply unit 1 and the load 14 for separation of the DC part of the signal supplied to the load 14. The capacitor 16 lies directly in front of the load 14. Due to the upwards transformation of the resistance by the parallel oscillating circuit 24 the capacitor 16 has a smaller capacitance value and is stressed with lower currents than the dispensed capacitor 5 of the traditional class E amplifier shown in FIG. 15. Thus, higher quality and lower loss capacitors 16 may be used in the circuit shown in FIG. 6, which further increases the overall efficiency of the amplifier 1. The other further development relates to the inductor 21, which is arranged in series with the capacitor 19 of the matching filter network. The resulting series oscillating circuit is tuned to the first harmonic wave. Thus, a reduction of the non-linear distortion factor is achieved and as a consequence the power loss in the switching element is reduced.

Figure 7:
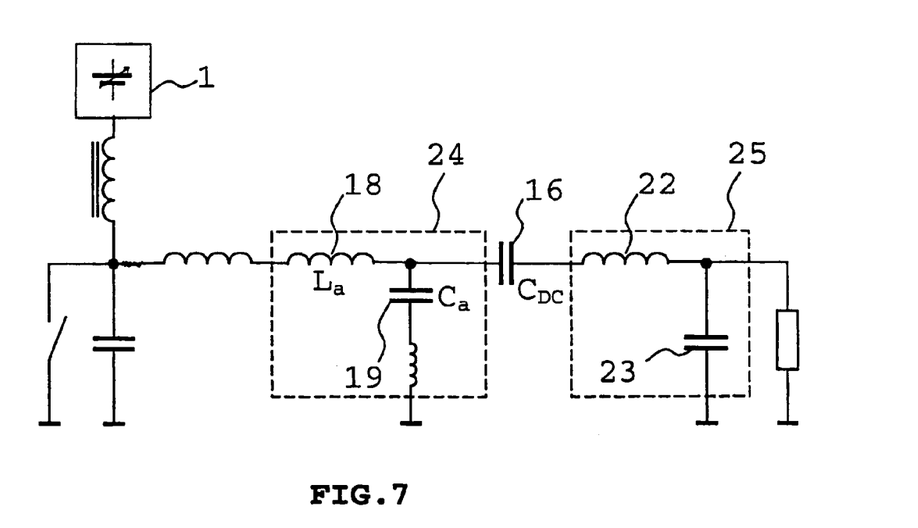
FIG. 7 is a schematic circuit diagram as in FIG. 6 including by a second matching section.

FIG. 7 shows a further development in which the matching network is distributed onto two half sections 24 and 25, and the capacitor 16 for decoupling the DC-current lies between the two matching half sections 24 and 25. Thereby, a second matching section 25 is added, which includes a series inductor 22 and a capacitor 23 parallel to the load 14, and the matching section 25 is dimensioned such that the transmission range in the region of the fundamental frequency is enlarged onto a limited band, whereby the circuit becomes less sensitive to frequency variation. At the same time, the contributions of all further harmonic waves are more strongly suppressed. An additional advantage of this development is that the resistance transformation is split up into two matching sections, and for the first matching section 24 the inductor 18 may be optimized for a small effective resistance and small winding capacitances against ground. By splitting the matching into two matching sections 24 and 25, the width of the strip conductor of the matching coil of the first stage of the matching section 24 can be chosen such that it generates in combination with the coil geometry a small high-frequency effective resistance for the fundamental frequency even at high currents. Thus, inductances of the required coils are reduced and coil geometries with higher quality factors may be realized. The coils can be realized as strip conductor inductors on a circuit board. Their geometries are chosen such that the high-frequency resistance for the fundamental wave is as small as possible, as described, however, still increases for all higher frequencies and thus attenuates those frequencies.

As shown in FIG. 7, capacitor 16 is connected between the two matching sections 24 and 25. In this way the parasitic inductance of the capacitor 16 can be used as the series inductance 22. The series circuit thus obtained between the capacitor 16 and the inductor 22 is dimensioned such that the quality factor is smaller than 1, and a frequency variation of this circuit has little effect on the overall function of the circuit.

FIG. 8 shows plots of attenuation behavior as a function of frequency for two different circuits, one (80, dotted line) for when a matching section is used and one (81, solid line) for when two matching half sections are used. The frequency of the fundamental wave lies at 82. The attenuation in the region 83 is the described consequence of the series inductance 21 shown in FIG. 6 at the first harmonic wave frequency. The stronger attenuation in the region 84 for the circuit with two matching half sections compared with the circuit with a single matching section may be clearly seen. The flat behavior in a limited region of the fundamental wave may also be clearly seen. Such an attenuation behavior may only be obtained with a special dimensioning of the two matching half sections. To this end, both matching half sections must have an almost equally distributed quality factor, which means that one of the matching half sections may not have a dominant effect compared to the other. The flat behavior of the attenuation curve in the region of the fundamental wave makes the circuit less sensitive to frequency variation and may advantageously be used, for example, in order to change the frequency of the amplifier deliberately in order to obtain matching to the load.

FIG. 9 shows a possible advantageous further embodiment of the current supply in node 28 based on the circuit shown in FIGS. 3, 4, or 5. The choke coil 2 is replaced by a parallel oscillating circuit 74 that includes an inductor 71 and two capacitors 72 and 73. The parallel oscillating circuit is tuned to the frequency of the fundamental wave. Thus, the inductance of the inductor 71 may be significantly reduced and the inductor 71 may be configured without iron (e.g., without a ferrite core). The embodiment of the parallel oscillating circuit 74 by two capacitors 72 and 73 connected to ground allows even high-frequency interference to be filtered.

As shown in FIG. 10 a power MOS-FET 49 used in one of the circuits described herein can be modeled in terms of several parasitic devices. The external terminals of the MOS-FET 49 are the source 41, the drain 42, and the gate 43. The parasitic capacitance 31 from the internal drain 32 to the internal source 33 forms part of the capacitance 4 in the class E amplifier. However, the capacitance 31 is voltage dependent, and, thus, the behavior of a real amplifier differs from that of an ideal class E amplifier. The capacitance 31 decreases with increasing voltage in a non-proportional way, and charging of this capacitance 31 leads to a non-negligible voltage overload in class E operation. Therefore, a dominant capacitor 4 that is constant over voltage is often used in parallel to the switch. The parasitic diode 34 from internal source 33 to internal drain 32 is integrated in MOS-FET power semiconductors due to their construction. This diode 34 becomes conductive, if a sufficiently high voltage is present from source 41 to drain 42 if the MOS-FET is tuned off or if a sufficiently high current flows from source 41 to drain 42 while the MOS-FET is turned on, such that the voltage drop at the turn-on resistance is higher than about 0.7 V, which is the transient voltage of this diode 34 in the conductive state.

If the current is reversed, charge carriers must be removed from the pn-junction of this diode 34, which leads to charge carriers nevertheless being transported and thus to a current flowing, even if the MOS-FET should be turned off during this time. In particular, in high-frequency circuits, this leads to undesired effects. When turning off the MOS-FET, one should pay attention that the parasitic diode 34 is not operated in the conductive state (e.g., causing the current flow to occur from drain 42 to source 41), which corresponds, for the class E-amplifier, to positive charging of the capacitor 4 at the time of turning off the switch 3. The terminal inductance 30 between the internal source 33 of the MOS-FET 49 and the corresponding external terminal 41 of the MOS-FET 49 is present due to its construction and is disturbing mainly when turning on the MOS-FET 49, if high current rise velocities are demanded. Due to the inductance 30, a voltage drop exists that is proportional to the inductance 30 and proportional to the current rise. To safely turn on the MOS-FET 49 in spite of this voltage drop, a suitably increased gate source voltage must be supplied. The gate-drain capacitance 35 and the gate-source capacitance 37 create a coupling from the amplifier side to the driver side, the effects of which must be taken into account and which are undesired most of the time. For switching the MOS-FET 49, these capacitances must be charged or discharged, namely via the inductance 38 and the resistance 39 at the gate terminal 43. Since this has to occur very quickly in high-frequency applications, high currents are necessary to this end. These high currents generate a power loss in the resistance 39 at the gate terminal and in the internal resistance of the driver circuit, which has a negative effect on the overall efficiency of the circuit. In particular, the capacitance 35 is, furthermore, voltage dependent. If the gate 43 of the MOS-FET with its parasitic elements is seen as a load of the driver circuit, the changing capacitances cause a change of the load impedance during turning on and turning off. In high-frequency circuits such changes are undesired since they may lead to reflections and interferences. The parasitic drain inductance 44 between the internal drain terminal 32 to the external terminal 42 is also integrated in each MOS-FET 49 and also influences the high-frequency behavior of the transistors.

FIG. 11 shows the driving of such a power MOS-FET 49 by means of a gate-oscillating circuit 50 that includes an inductor 45 and a capacitor 46 and is tuned, together with the parasitic inductivity 38 at the gate terminal, to the frequency of the fundamental wave. Due to the reactive current overload, this oscillating circuit delivers a sufficiently high current and a sufficiently high voltage for driving the MOS-FET 49, and, thus, the overall efficiency of the circuit is increased. The effective power, which is required for driving the MOS-FET 49, flows almost completely via the parasitic capacitance 35 into the output amplifier circuit and thus into the load circuit.

Advantageously, the gate oscillating circuit 50 is driven by a class E amplifier 51 mentioned above, whereby the gate oscillating circuit may be supplied with a relatively small and constant current, since only the energy taken from the load circuit and consumed in the gate resistance 39 must be replaced.

Figure 12:
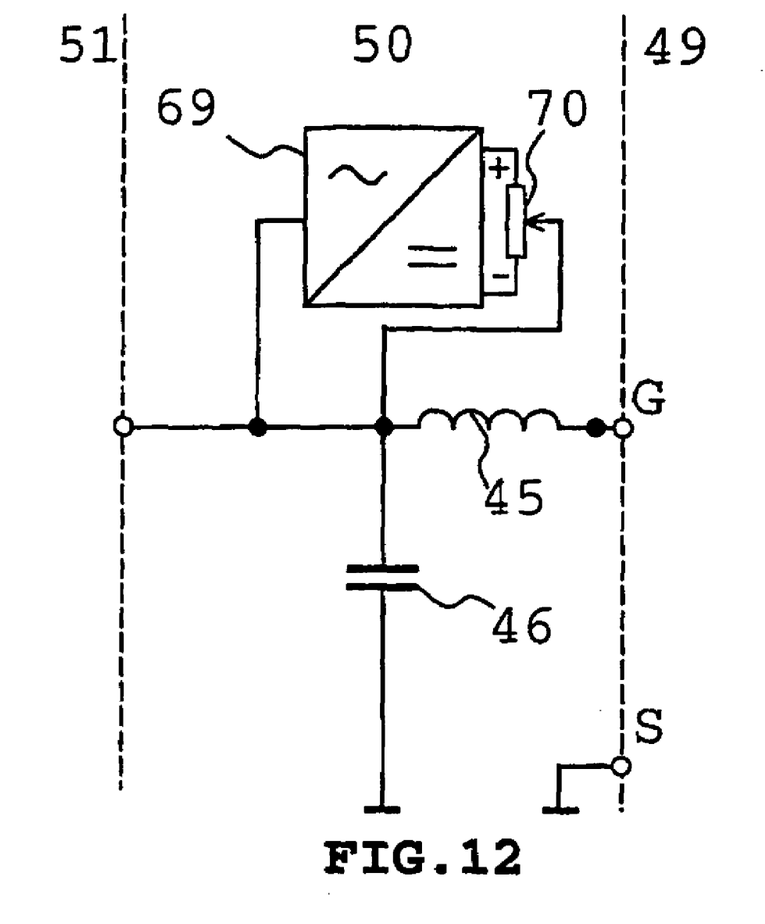
FIG. 12 is a schematic circuit diagram of an extension of the circuit according to FIG. 11.

FIG. 12 shows the circuit shown in FIG. 11, extended by a circuit for adjusting the pulse-to-pause ratio. Part of the high-frequency energy is taken from the gate oscillating circuit, and converted into a positive and negative DC-voltage in a rectifier circuit 69. The oscillating circuit may be biased with a freely adjustable positive or negative DC-voltage by means of a control element 70. By means of these biases the pulse-to-pause ratio for driving the gates of the power transistors may be matched. Energy is taken from the gate oscillating circuit by generating the DC-voltages, at the same time enabling limitation of the quality factor of the gate oscillation circuit and thus making the circuit less sensitive to frequency variation.

FIG. 13 shows a circuit similar to that of FIG. 11, except that a pair of MOS-FET transistors 49a and 49b is driven. An advantage of two interconnected MOS-FETs 49a and 49b is that the voltage, which drops at the parasitic coil 30 of the MOS-FET 49a or 49b is reduced. Thus, the required gate-source voltage decreases. Furthermore, MOS-FETs 49a or 49b may be used to achieve a lower switching current, which is advantageous from the cost point of view.

MOS-FETs 49a and 49b may be mounted in close proximity to one another, such that only small terminal inductances occur, although the internal parasitic reactive elements remain. Due to the fact that the individual transistors of the MOS-FET pair do not have identically equal turn-on times in a practical realization, oscillations in the parasitic reactive elements of the MOS-FET pair may be excited. These oscillations may generate a high power loss, destabilize the power amplifier and not infrequently also destroy the power amplifier, however, these oscillations can be attenuated by a capacitor 47. The capacitor 47 may be seen as part of the gate oscillation circuit and be compensated therethrough. Thus, no lossy and switching velocity decreasing effective resistances are needed for attenuating those oscillations.

FIG. 14 shows a schematic design of a high-frequency power generator 70. A clock signal is delivered by a reference oscillator 67 to an input stage 68, by which the clock signal is amplified and distributed onto four parallel driver stages 53, 54, 55 and 56 with equal throughput time. Each driver stage 53–56 includes a sub-driver 57, a driver amplifier 58, and a final stage circuit 59. The sub-drivers 57 include mono-flops that drive the driver amplifiers 58 with a variable duty cycle (e.g., with a pulse-to-pause ratio of about 40%/60%. The circuits of the driver amplifiers 58 correspond to the regions 50 and 51 in FIG. 11 or FIG. 13, wherein the switch 48 is preferably a MOS-FET, which is driven by the sub-driver 57. The outputs of the driver amplifiers 58 drive the final stage circuits 59, which is a circuit with phase correction according to region 29 of FIG. 4 or FIG. 5 with a switch 3a, 3b, 3c, 3d, 3e, or 3f each, preferably embodied as a MOS-FET according to region 49 of FIG. 11 or as a pair of MOS-FETs according to region 49a and 49b of FIG. 13 and the capacitor 4a, 4b, 4c, 4d, 4e, or 4f. The outputs of the final stage circuits 59 are at the same time the outputs of the driver stages 53–56 and are interconnected at a node point 60, wherein the currents add at the correct phase in node 60. The capacitor 69 is also connected to this node point, and the capacitor 69 corresponds in terms of its function to the capacitor 19 in FIGS. 1, 3, 4, or 5. From a main supply unit 61, the current is supplied to the node point 60 via a choke coil 62, although the choke coil 62 can replaced by a parallel oscillating circuit 74 according to FIG. 9, as described above. The node point 60 is preferably connected to a further output network 63 for power matching, harmonic wave blocking, and correction of frequency variation. The output signal of the output network 63 is supplied to a working load 65. The working load may be, for example, a plasma chamber, a laser, or another consumer. Via a measurement unit 64 the power data of the output is collected. The measurement values are passed on to an open and closed loop control unit 66. This open and closed loop control unit 66 can adjust the output power of the working load by changing the supply voltage. The input stage 68 drives the driver stages 53–56 with the amplified clock signal of the reference oscillator 67 such that signals are present at the inputs of the driver stages 53–56 synchronously with the same signal waveform.

The switching frequency of the switching elements is in the embodiments equal to the fundamental frequency of the generated high frequency.

An inventive method and device for power amplification with a modified class E amplifier has been described, in which a special matching network performs a band-pass filtering for the fundamental wave as well as resistance matching to the load, and which is at the same time, due to its construction as matching network, suitable for interconnecting several non-identical power MOS-FETs, as well as such a matching circuit, as well as a suitable particularly low-loss driver circuit for driving such power MOS-FETs.

OTHER EMBODIMENTS

A number of embodiments of the invention have been described. Nevertheless, it will be understood that various modifications may be made. Accordingly, other embodiments are within the scope of the following claims.

What is claimed is:

1. A power amplifier for generating a sinusoidal high-frequency signal to be supplied to a load, the power amplifier comprising:
   a current source adapted to supply a constant electrical current during a portion of a period of a fundamental wave;
   a first driver circuit that generates a first current wave, the circuit comprising:
      a first switching element adapted to switch at a fundamental frequency of the fundamental wave between a high ohmic state and a low ohmic state to draw current from the current source;
      a first capacitance connected in parallel to the first switching element; and
      a first reactive element to phase shift a first periodic signal,
      wherein the first driver circuit has a first internal resistance;
   a second driver circuit for generating a second current wave, the circuit comprising:
      a second switching element adapted to switch at the fundamental frequency of the fundamental wave between a high ohmic state and a low ohmic state to draw current from the current source;
      a second capacitance connected in parallel to the second switching element; and
      a second reactive element to phase shift a second periodic signal,
      wherein the second driver circuit has a second internal resistance;
   a filter network comprising an oscillating circuit comprising a capacitor connected in parallel with the load and a first inductor connected in series with the first internal resistance and a second inductor in series with the second internal resistance, wherein the oscillating circuit is tuned to the fundamental frequency of the fundamental wave and wherein the oscillating circuit is adapted to perform a resistance transformation from the first and second internal resistances of the driver circuits to the load; and
   at least one resistor arranged between the first driver circuit and the second driver circuit, wherein a resistance of the resistor is selected to cause a phase correction between the first current wave and the second current wave.

2. The power amplifier of claim 1, further comprising:
   a first resistor comprising a first terminal connected between the first inductor and the first driver circuit and a second terminal connected to a star point; and
   a second resistor comprising a first terminal connected between the second inductor and the second driver circuit and a second terminal connected to the star point.

3. The power amplifier of claim 1, wherein the current source, the first and second inductors, and the capacitor parallel to the load are connected in a node.

4. The power amplifier of claim 1, further comprising a capacitor between the filter network and the load adapted to filter out a DC component of the signal to be supplied to the load.

5. The power amplifier of claim 1, wherein the current source further comprises a parallel oscillating circuit tuned to the fundamental frequency.

6. The power amplifier of claim 1, wherein the filter network further comprises a second inductor in series with the capacitor and wherein a resonant frequency of the second inductor and the capacitor of the filter network is adapted to attenuate a first harmonic frequency of the fundamental frequency.

7. The power amplifier of claim 1, wherein the filter network is adapted to pass a broadband of frequencies in the range of the fundamental wave while suppressing harmonic frequencies.

8. The power amplifier of claim 7, wherein the filter network further comprises two matching half-sections, wherein each half-section comprises an oscillating circuit having a capacitor in parallel with the load and an inductor in series with the load, wherein each half-section is tuned to the fundamental frequency and wherein the filter network further comprises a capacitor connected in series with the two half-sections for filtering a DC component of the signal.

9. The power amplifier of claim 1, wherein the first switching element comprises at least one MOS-FET and wherein the second switching element comprises at least one MOS-FET.

10. A method of generating a sinusoidal high-frequency signal for operating a load, the method comprising:
    providing a current source to supply constant electrical current during a portion of a period of a fundamental wave;
    switching a first switching element switching at a fundamental frequency of the fundamental wave between a high ohmic state and a low ohmic state to generate a first current wave;
    phase-shifting the first current wave with a first reactive element;
    switching a second switching element at a fundamental frequency of the fundamental wave between a high ohmic state and a low ohmic state to generate a second current wave;
    phase-shifting the second current wave with a second reactive element;
    matching a first internal resistance of the first switching element and the first reactive element and a second internal resistance of the second switching element and the second reactive element to a resistance of the load with a matching filter network comprising an oscillating circuit having a capacitor connected in parallel with the load and a first inductor connected in series with the first internal resistance and a second inductor connected in series with the second internal resistance, wherein the oscillating circuit is tuned to the fundamental frequency; and
    aligning the phases of the first current wave and the second current wave.

11. The method of claim 10, further comprising decoupling a DC component of the signal directly upstream of the load.

12. The method of claim 10, further comprising filtering the signal with an oscillating circuit as a filter element tuned to the fundamental frequency to pass the fundamental frequency.

13. The method of claim 10, wherein the matching is performed by the matching filter network such that a broadband transmission range forms in the range of the fundamental frequency, and at the same time waves with harmonic frequencies are suppressed.

14. The method of claim 1, further comprising repeatedly switching the switching element between the high ohmic state and the low ohmic state with a period in which the switching element is in the high ohmic state for about 60% of the period and is in the low ohmic state for about 40% of the period.

* * * * *

UNITED STATES PATENT AND TRADEMARK OFFICE
CERTIFICATE OF CORRECTION

| | | |
|---|---|---|
| PATENT NO. | : 7,046,088 B2 | Page 1 of 1 |
| APPLICATION NO. | : 10/937395 | |
| DATED | : May 16, 2006 | |
| INVENTOR(S) | : Joachim Ziegler | |

It is certified that error appears in the above-identified patent and that said Letters Patent is hereby corrected as shown below:

In column 14, line 60, please amend "The method of claim 1" to read --The method of claim 10--.

Signed and Sealed this
Fifth Day of April, 2011

David J. Kappos
*Director of the United States Patent and Trademark Office*